United States Patent
Yeh et al.

(10) Patent No.: US 8,647,531 B2
(45) Date of Patent: Feb. 11, 2014

(54) PHOSPHORS AND VISIBLE AND UV LIGHT EMITTING DEVICES UTILIZING THE SAME

(75) Inventors: Yao-Tsung Yeh, Taoyuan (TW); Wei-Ren Liu, Hsinchu (TW); Yi-Chen Chiu, Hsinchu (TW); Shyue-Ming Jang, Hsinchu (TW); Yen-Ying Kung, New Taipei (TW); Teng-Ming Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 205 days.

(21) Appl. No.: 13/353,418

(22) Filed: Jan. 19, 2012

(65) Prior Publication Data
US 2013/0063021 A1    Mar. 14, 2013

(30) Foreign Application Priority Data
Sep. 14, 2011   (TW) .............................. 100132977 A

(51) Int. Cl.
C09K 11/81    (2006.01)
C09K 11/71    (2006.01)

(52) U.S. Cl.
USPC .............. 252/301.4 P; 252/301.6 P; 257/98; 313/503; 313/486; 313/643

(58) Field of Classification Search
USPC ...... 252/301.4 P, 301.6 P; 313/486, 643, 503; 257/98
See application file for complete search history.

(56) References Cited

U.S. PATENT DOCUMENTS

2009/0243467 A1   10/2009   Shimizu et al.

FOREIGN PATENT DOCUMENTS

TW   200825155        6/2008
TW   I326704 B        7/2010

OTHER PUBLICATIONS

Tie et al., "Investigation on the Luminescence of Ln3+(Ln=Eu, Gd, and Dy) in Hexagonal KCaR(PO4)2 Phosphates (R = Gd, Y)", phys. stat. sol. (a) 147, 267, 1995, pp. 267-276.
Tie et al., "Structure and site-symmetry investigation on the hexagonal KCaY(PO4)2", Elsevier, Journal of Alloys and Compounds, 227, 1995, pp. 1-4.
Wang et al., "Spectroscope properties of KCay(P04)2:Eu3+ in vaccum ultraviolet region", Elsevier, Materials Science and Engineering B 133, 2006, pp. 218-221.
Zhang et al., "Investigation on the luminescence of RE3+ (Re = Ce, Tb, Eu and Tm) in KMGd(PO4)2 (M = Ca, Sr) phosphates", Elsevier, Optical Materials 30, 2008, pp. 1848-1853.
Zhang et al., "Vacuum ultraviolet spectroscopic properties of rare earth (Re=Ce, Tb, Eu, Tm, Sm)-doped hexagonal KCaGd(P04)2 phosphate", Journal of Applied Physics, 102, 093514, 2007, (8 pages).
Zhang et al., "VUV-UV spectroscopic properties of RE (RE3+= Ce, Eu and Tb)-doped KMLn(PO4)2 (M2+= Ca, Sr; Ln3+= Y, La, Lu)", Elsevier, Optical Materials 32, 2009, pp. 99-103.

*Primary Examiner* — Carol M Koslow
(74) *Attorney, Agent, or Firm* — Birch, Stewart, Kolasch & Birch, LLP

(57) ABSTRACT

Disclosed is a phosphor having a formula of $M(M'_{1-y-z}Eu_yMn_z)(M''_{1-x}Pr_x)(PO_4)_2$. M is a monovalent metal element selected from Li, Na, K, or combinations thereof. M', Eu, and Mn are divalent metal elements, and M' is selected from Ca, Sr, Ba, Mg, Zn, or combinations thereof. M" and Pr are trivalent metal elements, and M" is selected from Sc, Y, La, Lu, Al, Ga, In, or combinations thereof. $0 \leq x \leq 0.2$, $0 \leq y \leq 0.1$, $0 \leq z \leq 0.2$, and $x+y+z \neq 0$.

9 Claims, 15 Drawing Sheets

US 8,647,531 B2

PHOSPHORS AND VISIBLE AND UV LIGHT EMITTING DEVICES UTILIZING THE SAME

CROSS REFERENCE TO RELATED APPLICATIONS

This Application claims priority of Taiwan Patent Application No. 100132977, filed on Sep. 14, 2011, the entirety of which is incorporated by reference herein.

BACKGROUND OF THE INVENTION

1. Field of the Invention

The disclosure relates to a phosphor, and in particular relates to a light emitting device utilizing the same.

2. Description of the Related Art

Excitation and emission properties of inorganic phosphors are mainly determined by host materials, activators, and other dopants. Phosphors composed of different host materials, activators or other dopants may have different luminescent properties, such that the composition is the most important factor to tune optoelectronic properties of the phosphors. Mainstream host materials of inorganic phosphors are sulfides, oxides, oxysulfides, or other complex oxides such as silicates, aluminates, phosphates, and the likes. Recently, phosphor development of host materials has been partly moved towards nitrides and oxynitrides. The major activators being used are ions of transition metal elements or rare-earth elements.

A future light source should meet environmental protection requirements of mercury-less/mercury-free, such that a $Xe_2^*$ excimer lamp and light emitting diode (LED) with high efficiency will possibly become a mainstream future light source. Whether the $Xe_2^*$ excimer lamp or the LED is adopted, it should probably collocate with a phosphor to convert light from being a short wavelength to being a long wavelength. For example, the $Xe_2^*$ excimer lamp emits a vacuum ultraviolet (VUV) light having a wavelength of 172 nm, which can be converted by an appropriate phosphor to emit a UV-C light having a wavelength of 200 nm to 280 nm, which may be applied in disinfection, purification, TOC (total organic compounds) reduction, and the likes. The LED has a narrow emission band, which can be converted by an appropriate phosphor to complete a white light emitting diode, which may be applied in illumination, displays, and the likes. Accordingly, the $Xe_2^*$ excimer lamp and the LED need appropriate phosphors. However, conventional phosphors excitable by the VUV light from the $Xe_2^*$ excimer lamp are rare, and conventional phosphors excitable by the LED are bounded by patents, respectively. Accordingly, developments of novel phosphors are still called for.

BRIEF SUMMARY OF THE INVENTION

One embodiment of the disclosure provides a phosphor, having a formula: $M(M'_{1-y-z}Eu_yMn_z)(M''_{1-x}Pr_x)(PO_4)_2$, wherein M is a monovalent metal element selected from Li, Na, K, or combinations thereof, M', Eu, and Mn are divalent metal elements, and M' is selected from Ca, Sr, Ba, Mg, Zn, or combinations thereof, M'' and Pr are trivalent metal elements, and M'' is selected from Sc, Y, La, Lu, Al, Ga, In, or combinations thereof, wherein $0 \le x \le 0.2$, $0 \le y \le 0.1$, $0 \le z \le 0.2$, and $x+y+z \ne 0$.

One embodiment of the disclosure provides an ultraviolet light emitting device, comprising: an excitation light source; and the described phosphor, wherein the excitation emits a light having a wavelength of 140 nm to 240 nm.

One embodiment of the disclosure provides a visible light emitting device, comprising: an excitation light source, and the described phosphor, wherein the excitation emits a light having a wavelength of 250 nm to 450 nm.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

In general, phosphors with a phosphate host material have a wide band gap, and can be doped with different activators to exhibit different excitation and emission characteristics. In short, the phosphate is a multi-purpose host material system. In embodiments of the disclosure, the phosphate MM'M''$(PO_4)_2$ is selected as a host material doped with the activators $Pr^{3+}$, $Eu^{2+}$, and $Mn^{2+}$. M is a monovalent metal element selected from Li, Na, K, or combinations thereof. M' is a divalent metal element selected from Ca, Sr, Ba, Mg, Zn, or combinations thereof. M'' is a trivalent metal element selected from Sc, Y, La, Lu, Al, Ga, In, or combinations thereof. Because a $Pr^{3+}$ ion has a suitable energy level to emit UV-C light, it can be doped into the phosphate host material MM'M''$(PO_4)_2$ to be applied as a UV light emitting phosphor. As such, the phosphate doped with $Pr^{3+}$ can be collocated with an $Xe_2^*$ excimer lamp to complete a UV-C light source free of mercury. On the other hand, the sensitizer-activator pair of $Eu^{2+}$ and $Mn^{2+}$ has energy transfer effect while co-doping with $Eu^{2+}$ and $Mn^{2+}$. The doping ratio of $Eu^{2+}$ and $Mn^{2+}$ can be changed to modify the visible emission light color of the phosphate phosphor MM'M''$(PO_4)_2$, which may serve as a color tunable phosphor in a white light emitting diode applied in the illumination or display fields.

According to one embodiment of the disclosure, the phosphate phosphor has a formula as below:

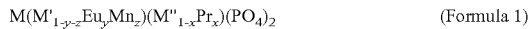

M(M'$_{1-y-z}$Eu$_y$Mn$_z$)(M''$_{1-x}$Pr$_x$)(PO$_4$)$_2$    (Formula 1)

In Formula 1, M is a monovalent metal element selected from Li, Na, K, or combinations thereof. M', Eu, and Mn are divalent metal elements, and M' is selected from Ca, Sr, Ba, Mg, Zn, or combinations thereof. M'' and Pr are trivalent metal elements, and M'' is selected from Sc, Y, La, Lu, Al, Ga, In, or combinations thereof. $0 \leq x \leq 0.2$, $0 \leq y \leq 0.1$, $0 \leq z \leq 0.2$, and $x+y+z \neq 0$.

Figure 1:
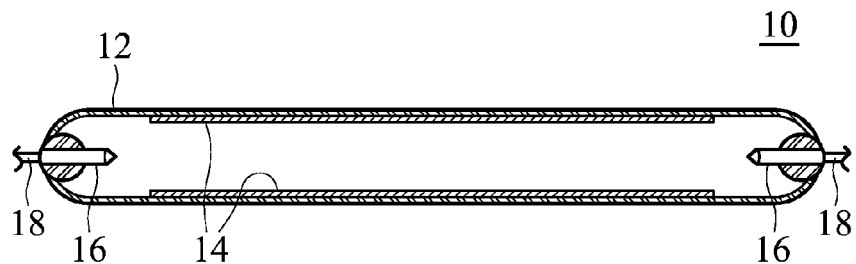
FIG. 1 shows an ultraviolet light emitting device according to one embodiment of the disclosure.

If y and z in Formula 1 are equal to 0 (y=z=0), the phosphor will have a formula of MM'(M''$_{1-x}$Pr$_x$)(PO$_4$)$_2$ and $x \neq 0$, wherein the phosphor can be excited by a light having a wavelength of 140 nm to 240 nm to emit an ultraviolet light having a major emission peak of 240 nm to 320 nm. The phosphor MM'(M''$_{1-x}$Pr$_x$)(PO$_4$)$_2$ can be applied in an ultraviolet light emitting device. According to one embodiment, the ultraviolet light emitting device 10 includes a lamp 12, an excitation light source 16, electrodes 18, and the phosphor 14 (MM'(M''$_{1-x}$Pr$_x$)(PO$_4$)$_2$) coated on the inner side of the lamp 12, as shown in FIG. 1. The excitation light source 16 can be a $Xe_2^*$ excimer lamp or other light source emitting a light having a wavelength of 140 nm to 240 nm.

Figure 2:
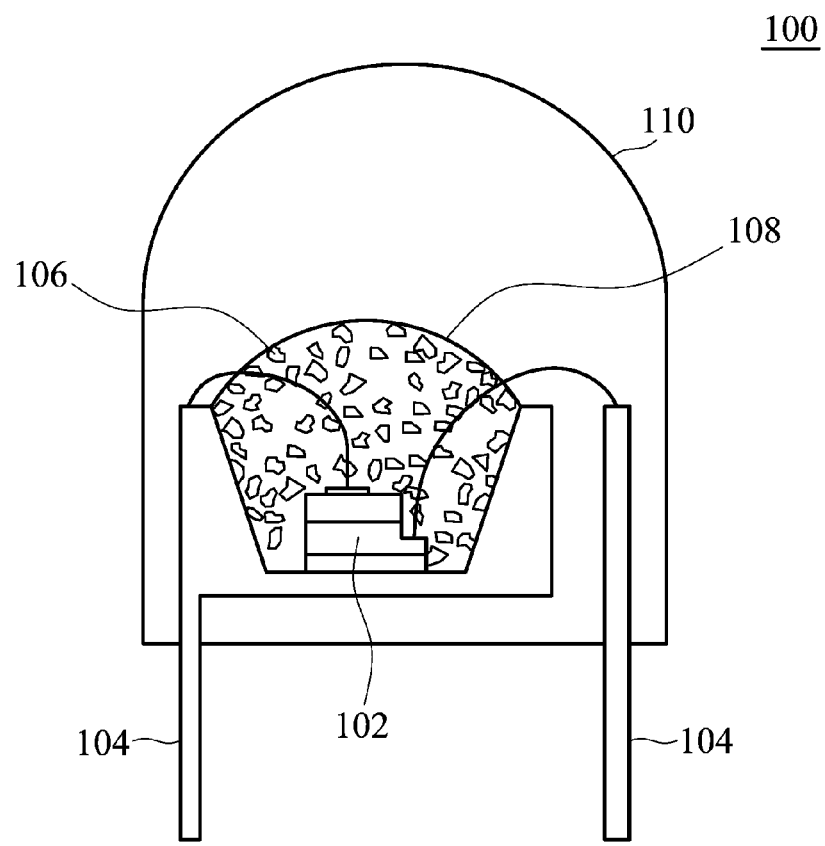
FIG. 2 shows a visible light emitting device according to one embodiment of the disclosure.

If x in Formula 1 is equal to 0 (x=0), the phosphor will have a formula of M(M'$_{1-y-z}$Eu$_y$Mn$_z$)M''(PO$_4$)$_2$ and $y+z \neq 0$, wherein the phosphor can be excited by a light having a wavelength of 250 nm to 450 nm to emit a visible light having a major emission peak of 450 nm to 750 nm. The phosphor M(M'$_{1-y-z}$Eu$_y$Mn$_z$)M''(PO$_4$)$_2$ can be applied in a visible light emitting device. According to one embodiment, the visible light emitting device 100 includes an excitation light source 102 having positive and negative electrodes electrically connected to lead frames 104 of opposite voltages, respectively. The phosphor 106 (M(M'$_{1-y-z}$Eu$_y$Mn$_z$)M''(PO$_4$)$_2$) is mixed into a transparent resin 108, and the mixture is then applied to encapsulating the excitation light source 102. Thereafter, the described structure is sealed by a sealing material 110 to complete the visible light emitting device as shown in FIG. 2. The excitation light source 102 can be an LED, laser diode, or other light source emitting a light having a wavelength of 250 nm to 450 nm.

In addition, the disclosure also provides a method to manufacturing the described phosphate phosphors. First, (1) a compound containing M and oxygen, (2) a compound containing M' and oxygen, (3) $(NH_4)_2HPO_4$ or $(NH_4)H_2PO_4$, and (4) a compound containing Pr (or Eu and Mn) and oxygen were mixed to obtain a mixture. The mixture is then sintered at a temperature of 950° C. to 1250° C. After the mixture is heated to the sintering temperature, the mixture is sintered at the sintering temperature for eight hours to thirty-two hours. According to the embodiments, the compounds containing M and oxygen can be metal oxides, metal carbonates, or metal nitrates of Li, Na, or K. In addition, the compound containing M', Pr (or Eu and Mn) and oxygen can be metal oxides or metal nitrites.

EXAMPLES

Example 1

According to molar ratios of KCa(Y$_{1-x}$Pr$_x$)(PO$_4$)$_2$, wherein x was 0.01, 0.02, 0.05, 0.1, and 0.15, respectively, appropriate stoichiometry of $K_2CO_3$, $CaCO_3$, $Y_2O_3$, $Pr_2O_3$, and $(NH_4)_2HPO_4$ were evenly mixed and ground for ten minutes, and charged into a crucible. The crucible was then heated in a high temperature furnace. After sintering at 950° C.-1250° C. in air, the phosphors KCa(Y$_{1-x}$Pr$_x$)(PO$_4$)$_2$ having different Y/Pr ratios were prepared.

Figure 3:
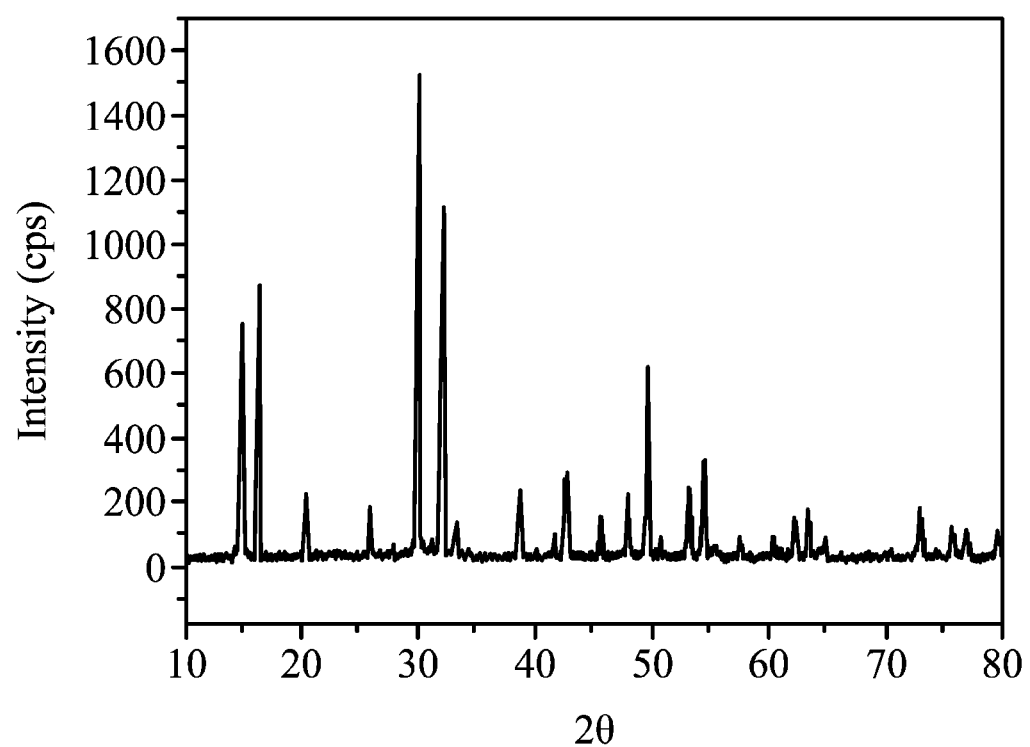
FIG. 3 shows an X-ray diffraction spectrum of the phosphor $KCa(Y_{0.9}Pr_{0.1})(PO_4)_2$ according to one embodiment of the disclosure.

FIG. 3 shows an X-ray diffraction spectrum of the phosphor KCa(Y$_{0.9}$Pr$_{0.1}$)(PO$_4$)$_2$, which has excellent crystallinity. As shown in FIG. 3, a small amount of doping $Pr^{3+}$ did not influence the crystal structure of the phosphor KCa(Y$_{0.9}$Pr$_{0.1}$)(PO$_4$)$_2$.

Figure 4:
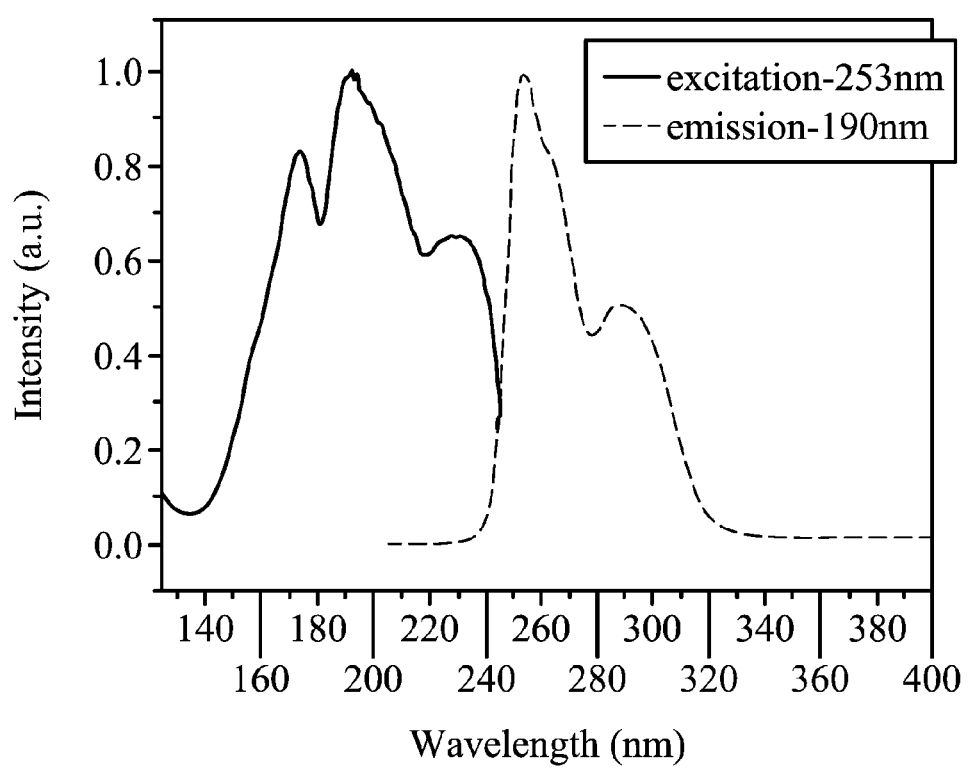
FIG. 4 shows a photoluminescence excitation (PLE) spectrum and a photoluminescence (PL) spectrum of the phosphor $KCa(Y_{0.9}Pr_{0.1})(PO_4)_2$ according to one embodiment of the disclosure.

FIG. 4 shows a photoluminescence excitation (PLE) spectrum and a photoluminescence (PL) spectrum of the phosphor KCa(Y$_{0.9}$Pr$_{0.1}$)(PO$_4$)$_2$. As shown in FIG. 4, the phosphor KCa(Y$_{0.9}$Pr$_{0.1}$)(PO$_4$)$_2$ has an excitation band of 140 nm to 240 nm, and an emission band of 240 nm to 320 nm.

Figure 5:
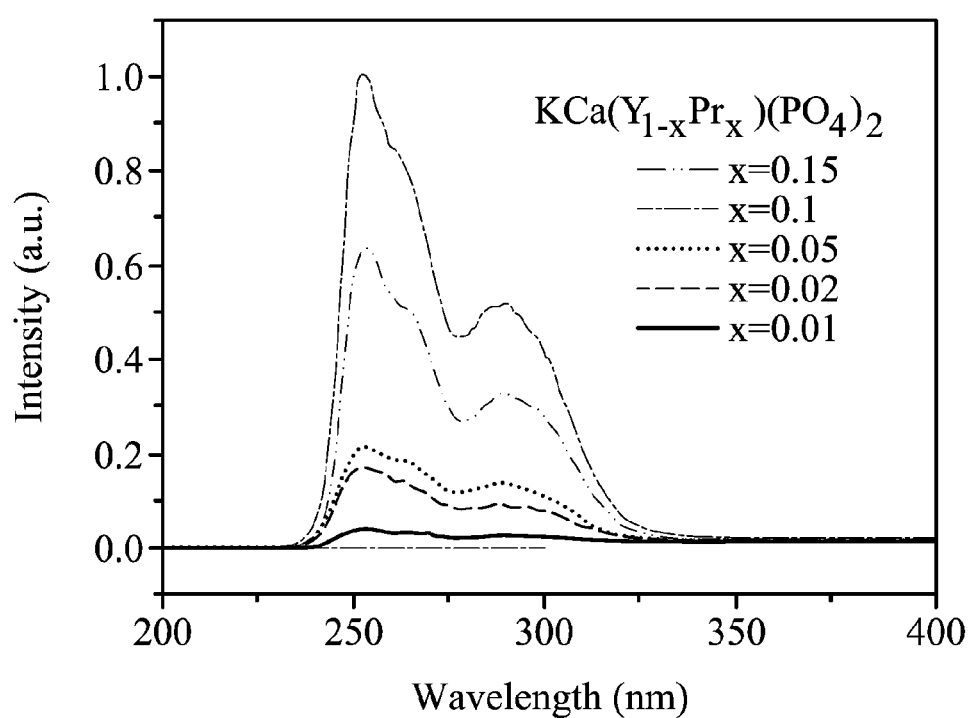
FIG. 5 shows emission spectra of the phosphors $KCa(Y_{1-x}Pr_x)(PO_4)_2$ having different doping ratios of the activator $Pr^{3+}$, wherein x was 0.01, 0.02, 0.05, 0.1, and 0.15, respectively, according to one embodiment of the disclosure.

FIG. 5 shows emission spectra of the phosphors KCa(Y$_{1-x}$Pr$_x$)(PO$_4$)$_2$ having different doping ratios of the activator $Pr^{3+}$, wherein x was 0.01, 0.02, 0.05, 0.1, and 0.15, respectively.

Figure 6:
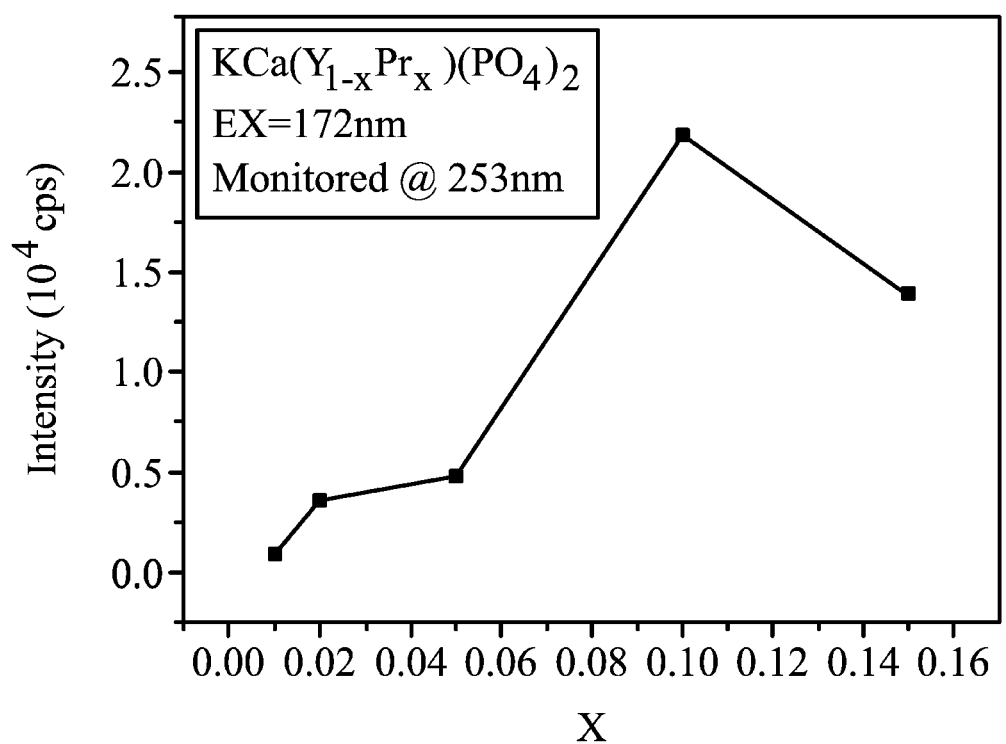
FIG. 6 shows a distribution of emission intensities at 253 nm of the phosphor $KCa(Y_{1-x}Pr_x)(PO_4)_2$, having different doping ratios of the activator $Pr^{3+}$, excited by an excitation light source of 172 nm according to one embodiment of the disclosure.

FIG. 6 shows a distribution of emission intensities at 253 nm of the phosphor KCa(Y$_{1-x}$Pr$_x$)(PO$_4$)$_2$, having different doping ratios of the activator $Pr^{3+}$, excited by an excitation light source of 172 nm. As shown in FIG. 6, the preferred doping ratio of the activator $Pr^{3+}$ is about 10% (x≈0.1).

Figure 7:
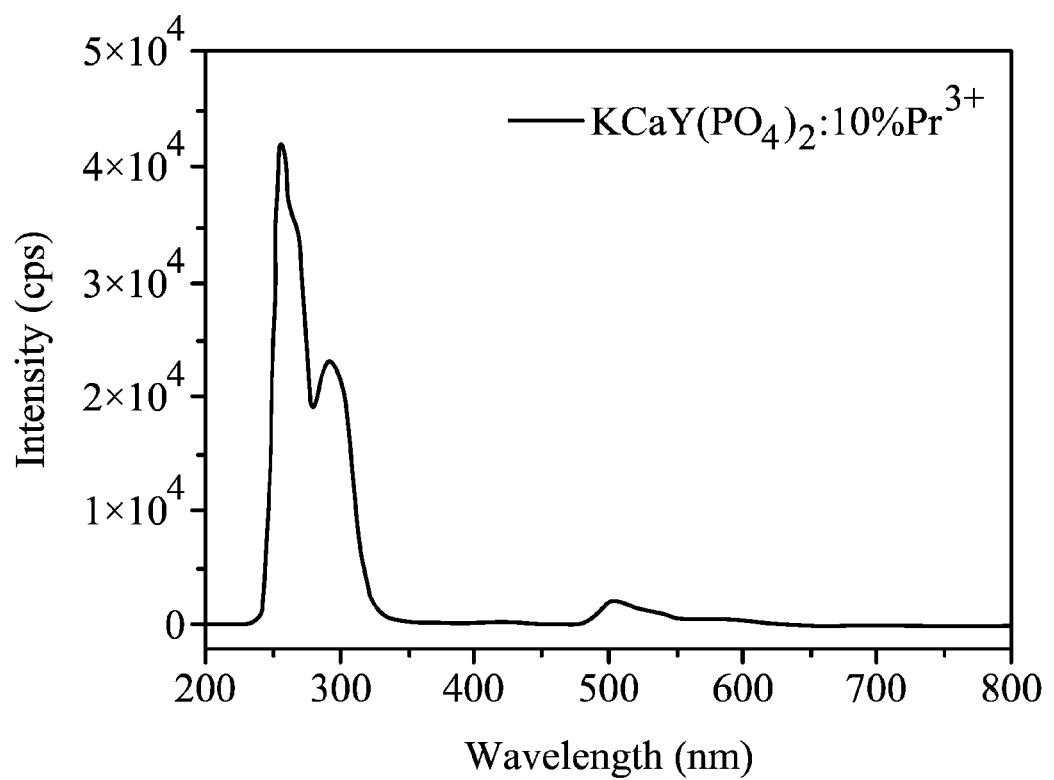
FIG. 7 shows a wide band type emission spectrum of the phosphor $KCa(Y_{0.9}Pr_{0.1})(PO_4)_2$ excited by an excitation light source of 172 nm.

For determining whether the phosphor KCa(Y$_{1-x}$Pr$_x$)(PO$_4$)$_2$ has excellent ultraviolet light emitting property, the wide band type emission spectra of the phosphors were further analyzed. FIG. 7 shows a wide band type emission spectrum of the phosphor KCa(Y$_{0.9}$Pr$_{0.1}$)(PO$_4$)$_2$ excited by an excitation light source of 172 nm. As shown in FIG. 7, the phosphor KCa(Y$_{0.9}$Pr$_{0.1}$)(PO$_4$)$_2$ emits a trace amount of a visible light around 550 nm, and emits a great amount of ultraviolet lights of 240 nm to 320 nm. As such, the phosphor KCa(Y$_{0.9}$Pr$_{0.1}$)(PO$_4$)$_2$ is an excellent ultraviolet light emitting phosphor.

Figure 8:
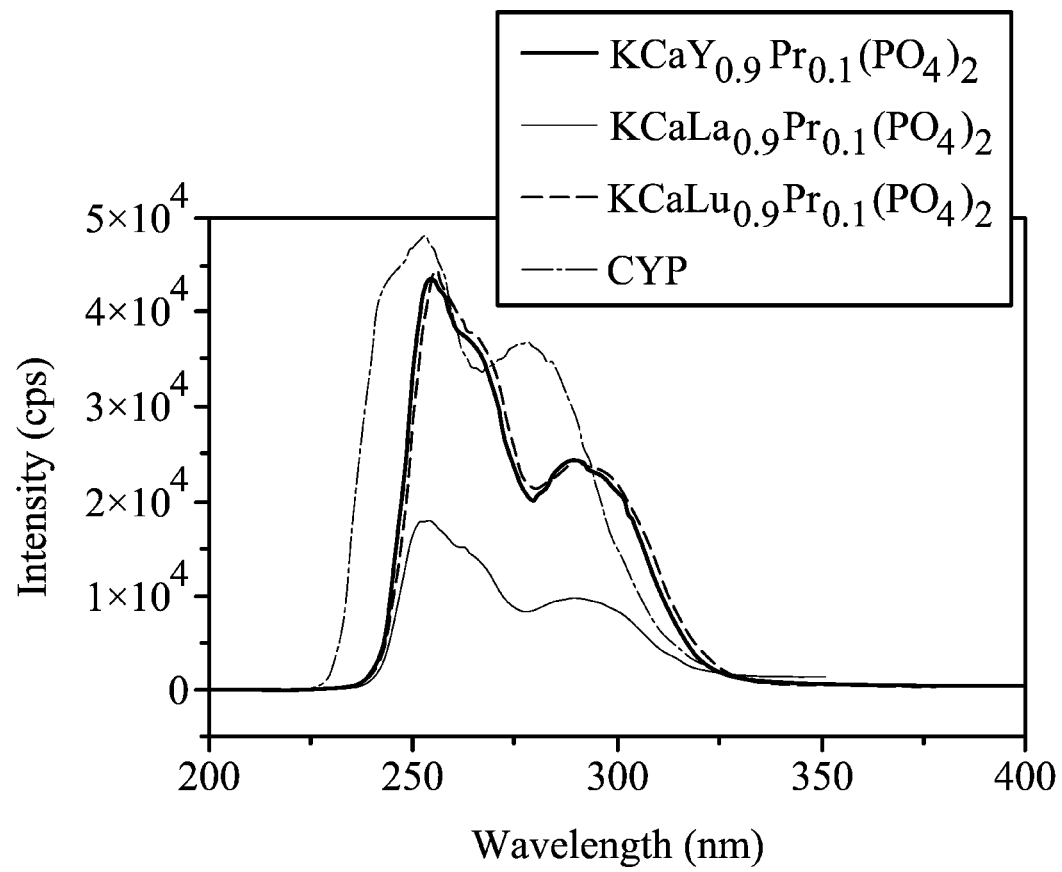
FIG. 8 shows an emission spectra comparison of the phosphors $KCa(M''_{0.9}Pr_{0.1})(PO_4)_2$ (M''=Y, La, or Lu) and CYP according to one embodiment of the disclosure.
Figure 9:
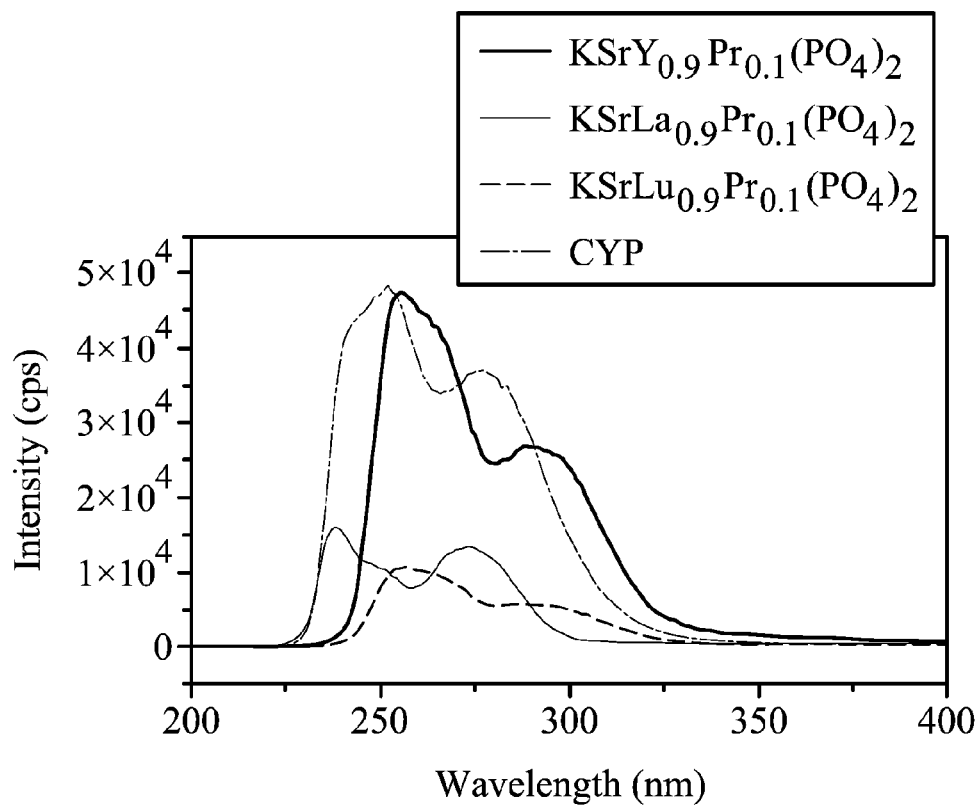
FIG. 9 shows an emission spectra comparison of the phosphors $KSr(M''_{0.9}Pr_{0.1})(PO_4)_2$ (M''=Y, La, or Lu) according to one embodiment of the disclosure.
Figure 10:
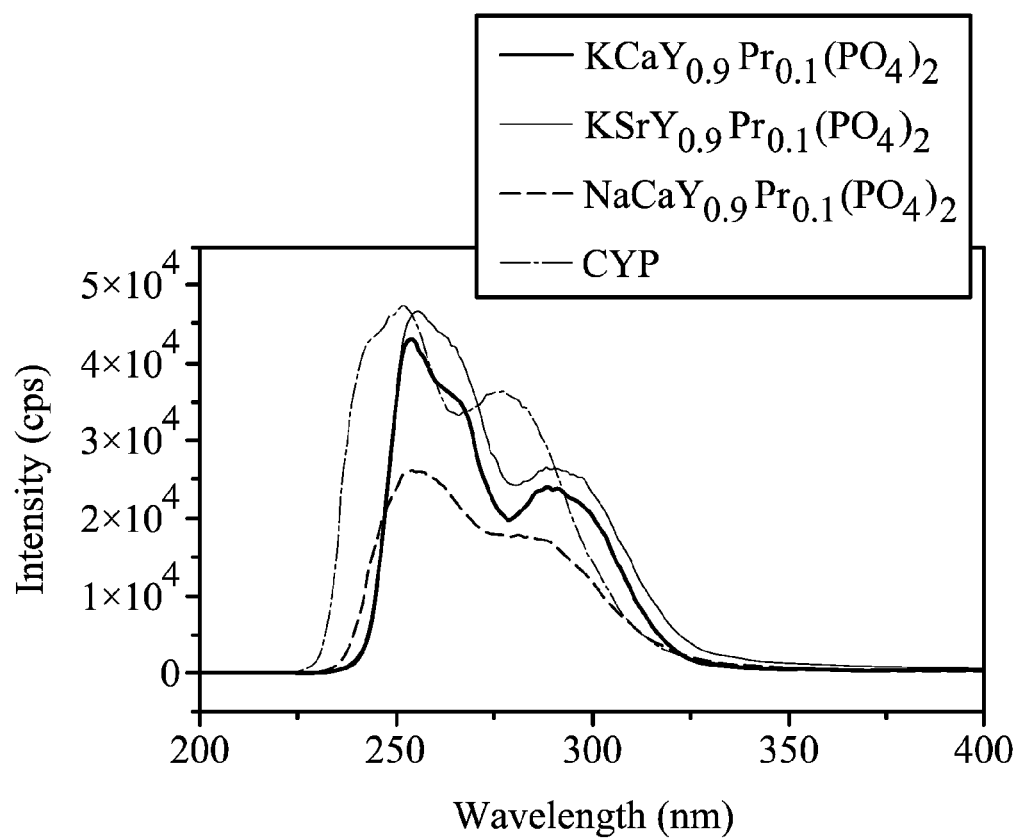
FIG. 10 shows an emission spectra comparison of the phosphor $NaCa(Y_{0.9}Pr_{0.1})(PO_4)_2$ according to one embodiment of the disclosure.

Similarly, the ultraviolet light emitting phosphor MM' $(M''_{1-x}Pr_x)(PO_4)_2$ having different cations may be synthesized by different raw materials (with corresponding stoichiometry) and similar processes. FIG. 8 shows an emission spectra comparison of the phosphors $KCa(M''_{0.9}Pr_{0.1})(PO_4)_2$ (M''=Y, La, or Lu) and CYP $(Ca_9(Y_{1-x}Pr_x)(PO_4)_7$, prepared by Example 23 in Taiwan Application No. 98134483). FIG. 9 shows an emission spectra comparison of the phosphors $KSr(M''_{0.9}Pr_{0.1})(PO_4)_2$ (M''=Y, La, or Lu). FIG. 10 shows an emission spectra comparison of the phosphor $NaCa(Y_{0.9}Pr_{0.1})(PO_4)_2$. As shown in FIGS. 8-10, the phosphors $KCa(Lu_{0.9}Pr_{0.1})(PO_4)_2$ and $KSr(Y_{0.9}Pr_{0.1})(PO_4)_2$ have similar ultraviolet light emitting efficiency as the phosphor $KCa(Y_{0.9}Pr_{0.1})(PO_4)_2$.

Example 2

According to molar ratios of $K(Ca_{0.99-z}Eu_{0.01}Mn_z)Y(PO_4)_2$, wherein z was 0, 0.01, 0.02, 0.04, 0.05, 0.07, and 0.10, respectively, appropriate stoichiometry of $K_2CO_3$, $CaCO_3$, $Y_2O_3$, EuO, MnO, and $(NH_4)_2HPO_4$ were evenly mixed and ground for ten minutes, and charged into a crucible. The crucible was then heated in a high temperature furnace. After sintering at 950° C.-1250° C. under air, the phosphors $K(Ca_{0.99-z}Eu_{0.01}Mn_z)Y(PO_4)_2$ having different Ca/Mn ratios were prepared.

Figure 11:
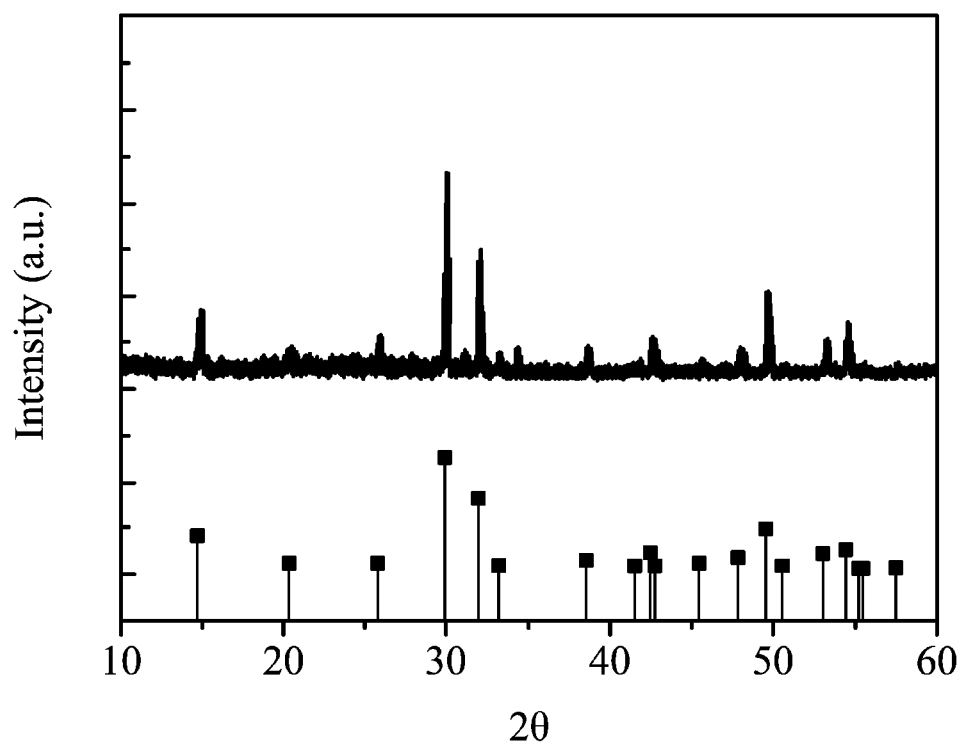
FIG. 11 shows an X-ray diffraction spectrum of the phosphor $K(Ca_{0.98}Eu_{0.01}Mn_{0.01})Y(PO_4)_2$ according to one embodiment of the disclosure.

FIG. 11 shows an X-ray diffraction spectrum of the phosphor $K(Ca_{0.98}Eu_{0.01}Mn_{0.01})Y(PO_4)_2$, which has excellent crystallinity. As shown in FIG. 3, a small amount of doping $Eu^{2+}$ and $Mn^{2+}$ did not influence the crystal structure of the phosphor $K(Ca_{0.98}Eu_{0.01}Mn_{0.01})Y(PO_4)_2$.

Figure 12:
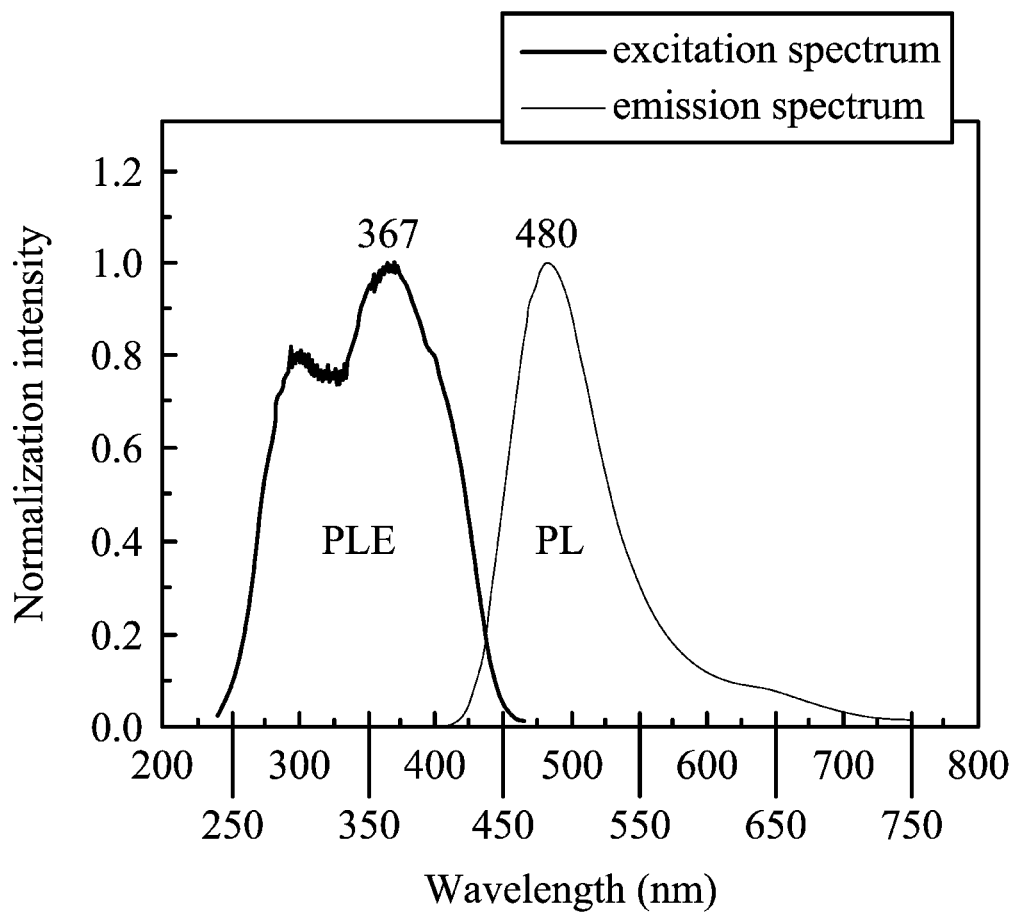
FIG. 12 shows a photoluminescence excitation (PLE) spectrum and a photoluminescence (PL) spectrum of the phosphor $K(Ca_{0.99}Eu_{0.01})Y(PO_4)_2$, according to one embodiment of the disclosure.

FIG. 12 shows a photoluminescence excitation (PLE) spectrum and a photoluminescence (PL) spectrum of the phosphor $K(Ca_{0.99}Eu_{0.01})Y(PO_4)_2$. As shown in FIG. 12, the phosphor $K(Ca_{0.99}Eu_{0.01})Y(PO_4)_2$ has an excitation band of 250 nm to 450 nm, an emission band of 425 nm to 700 nm, and an emission peak of about 480 nm.

Figure 13:
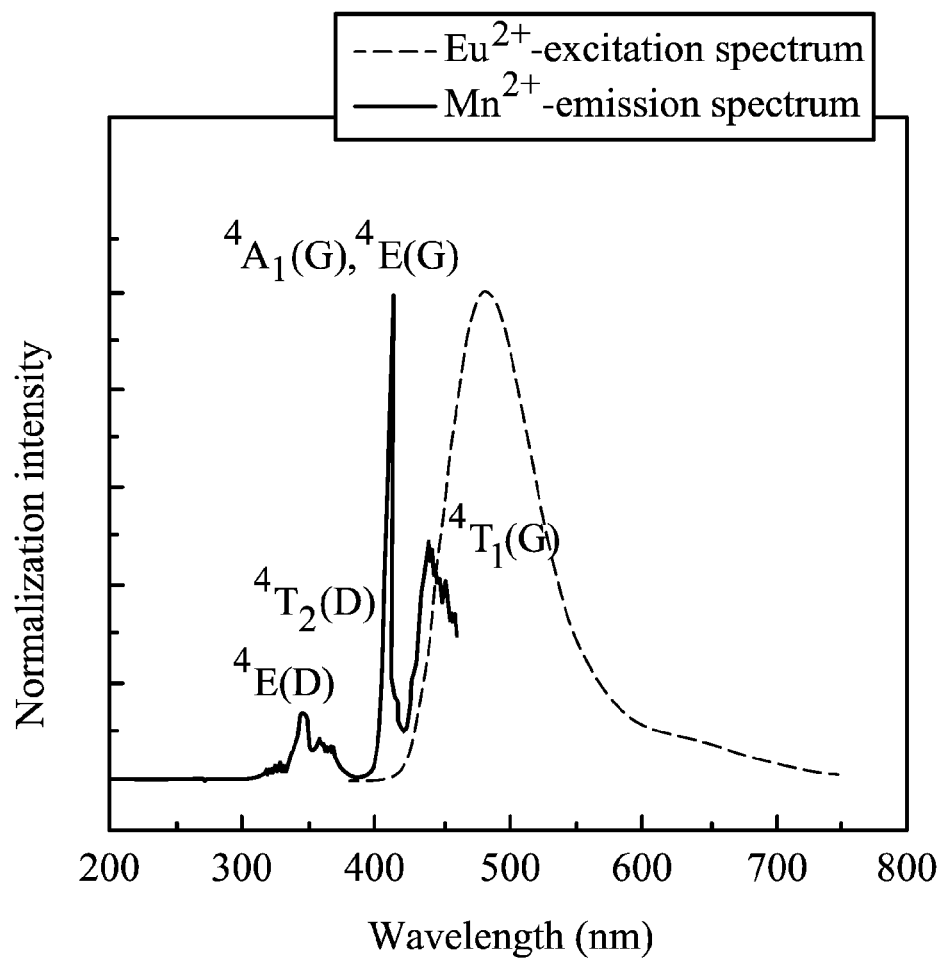
FIG. 13 shows an emission spectrum of $Eu^{2+}$ and an excitation spectrum of $Mn^{2+}$ in the phosphors $K(Ca_{1-y-z}Eu_yMn_z)Y(PO_4)_2$ according to one embodiment of the disclosure.

FIG. 13 shows an emission spectrum of $Eu^{2+}$ and an excitation spectrum of $Mn^{2+}$ in the phosphors $K(Ca_{1-y-z}Eu_yMn_z)Y(PO_4)_2$, wherein y+z≠0. As shown in FIG. 13, the emission spectrum of $Eu^{2+}$ overlaps with the excitation spectrum of $Mn^{2+}$, thereby causing energy transfer. In other words, $Eu^{2+}$ may serve as a sensitizer of $Mn^{2+}$.

Figure 14:
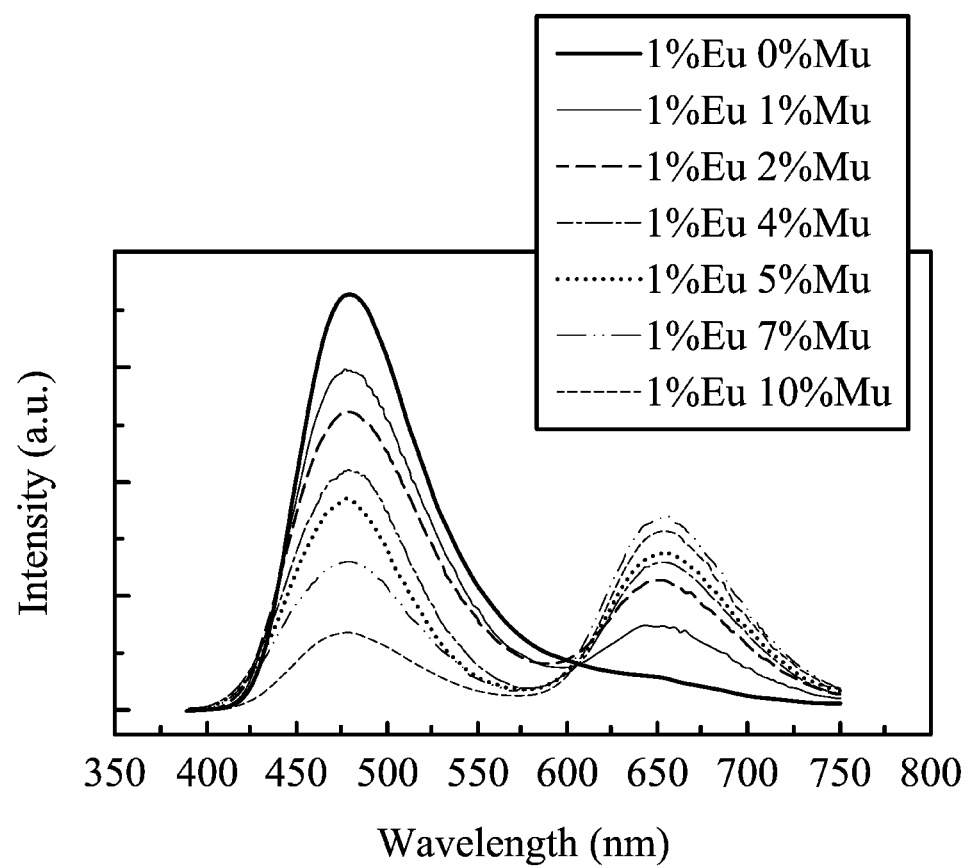
FIG. 14 shows an emission spectra comparison of the phosphors $K(Ca_{0.99-z}Eu_{0.01}Mn_z)Y(PO_4)_2$ having different doping ratios of the activator $Mn^{2+}$ according to one embodiment of the disclosure.

FIG. 14 shows an emission spectra comparison of the phosphors $K(Ca_{0.99-z}Eu_{0.01}Mn_z)Y(PO_4)_2$ having different doping ratios of the activator $Mn^{2+}$, wherein the doping ratio of $Eu^{2+}$ was 1%.

Figure 15:
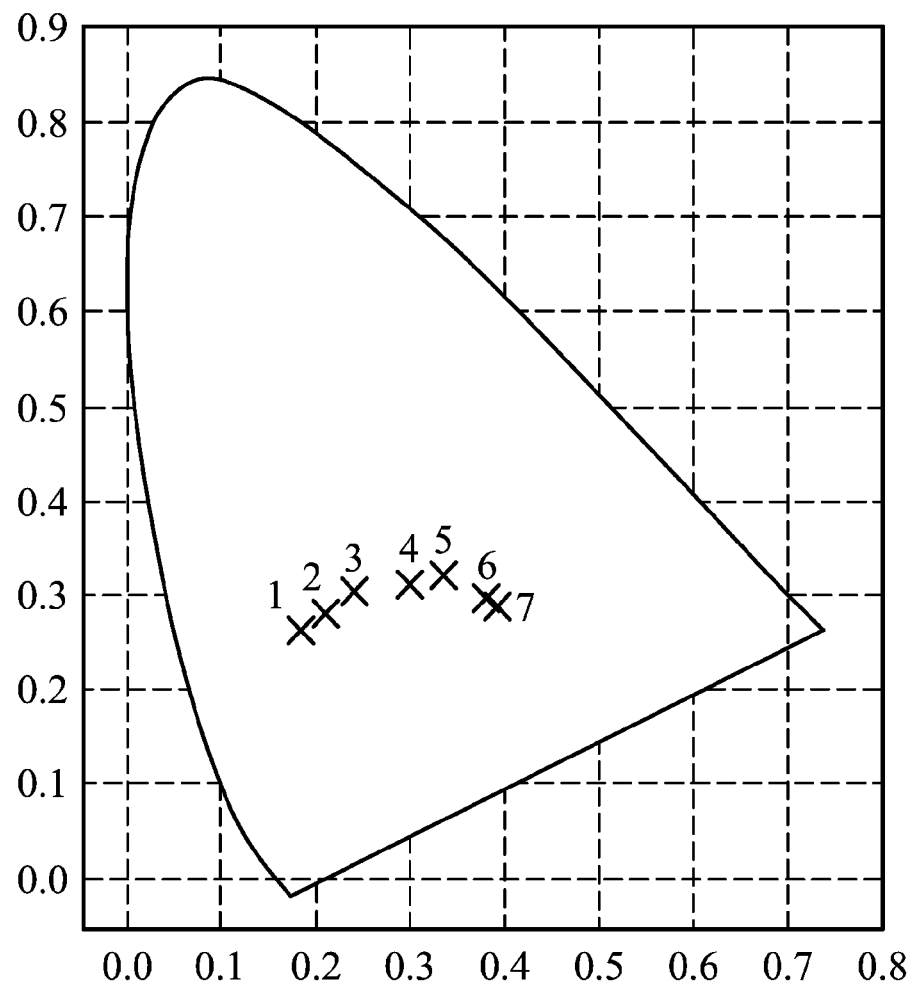
FIG. 15 shows CIE coordinates of the phosphors $K(Ca_{0.99-z}Eu_{0.01}Mn_z)Y(PO_4)_2$ having different doping ratios of the activator $Mn^{2+}$ according to one embodiment of the disclosure.

FIG. 15 shows CIE coordinates of the phosphors $K(Ca_{0.99-z}Eu_{0.01}Mn_z)Y(PO_4)_2$ having different doping ratios of the activator $Mn^{2+}$, wherein the doping ratio of $Eu^{2+}$ was 1%. As shown in FIG. 15, the CIE coordinates of the phosphor $K(Ca_{0.99-z}Eu_{0.01}Mn_z)Y(PO_4)_2$ shift from green blue to red purple when the doping ratio of the activator $Mn^{2+}$ increases. The detailed CIE coordinates of the phosphors $K(Ca_{0.99-z}Eu_{0.01}Mn_z)Y(PO_4)_2$ are shown in Table 1.

TABLE 1

| No. | Composition | CIE (x, y) |
|---|---|---|
| 1 | $K(Ca_{0.99}Eu_{0.01})Y(PO_4)_2$ | (0.1853, 0.2627) |
| 2 | $K(Ca_{0.98}Eu_{0.01}Mn_{0.01})Y(PO_4)_2$ | (0.2107, 0.2796) |
| 3 | $K(Ca_{0.97}Eu_{0.01}Mn_{0.02})Y(PO_4)_2$ | (0.2399, 0.3032) |
| 4 | $K(Ca_{0.95}Eu_{0.01}Mn_{0.04})Y(PO_4)_2$ | (0.3001, 0.3102) |
| 5 | $K(Ca_{0.94}Eu_{0.01}Mn_{0.05})Y(PO_4)_2$ | (0.3350, 0.3203) |
| 6 | $K(Ca_{0.92}Eu_{0.01}Mn_{0.07})Y(PO_4)_2$ | (0.3810, 0.2951) |
| 7 | $K(Ca_{0.89}Eu_{0.01}Mn_{0.1})Y(PO_4)_2$ | (0.3919, 0.2867) |

Figure 16:
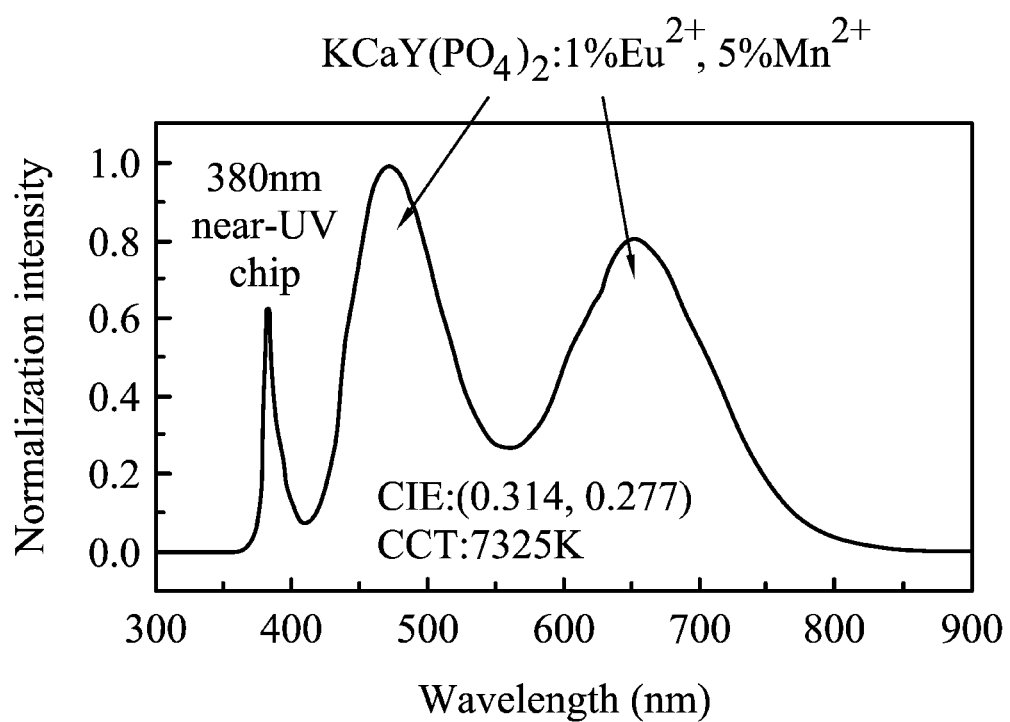
FIG. 16 shows an emission spectrum of a white light emitting diode manufactured of the phosphor $K(Ca_{0.94}Eu_{0.01}Mn_{0.05})Y(PO_4)_2$ collocated with a near-UV LED chip having an emission wavelength of 380 nm according to one embodiment of the disclosure.

FIG. 16 shows an emission spectrum of a white light emitting diode fabricated by the phosphor $K(Ca_{0.94}Eu_{0.01}Mn_{0.05})Y(PO_4)_2$ collocated with a near-UV LED chip having an emission wavelength of 380 nm. As shown in FIG. 16, the single phosphor $K(Ca_{0.94}Eu_{0.01}Mn_{0.05})Y(PO_4)_2$ having two emission peaks may be collocated with the near-UV LED chip to complete the white light emitting diode, which emitted a light having a color temperature of 7325K and a CIE coordinate of (0.314, 0.277).

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phosphor, having a formula:

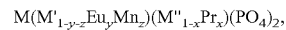

wherein M is a monovalent metal element selected from Li, Na, K, or combinations thereof,
M', Eu, and Mn are divalent metal elements, and M' is selected from Ca, Sr, Ba, Mg, Zn, or combinations thereof,
M'' and Pr are trivalent metal elements, and M'' is selected from Sc, Y, La, Lu, Al, Ga, In, or combinations thereof,
0≤x≤0.2,
0≤y≤0.1,
0≤z≤0.2, and
x+y+z≠0.

2. The phosphor as claimed in claim 1, having a formula:

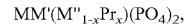

wherein x≠0, and
wherein the phosphor is excited by a light having a wavelength of 140 nm to 240 nm to emit an ultraviolet light having a major emission peak of 240 nm to 320 nm.

3. The phosphor as claimed in claim 2, having a formula of $KCa(Y_{1-x}Pr_x)(PO_4)_2$, $KCa(La_{1-x}Pr_x)(PO_4)_2$, $KCa(Lu_{1-x}Pr_x)(PO_4)_2$, $KSr(Y_{1-x}Pr_x)(PO_4)_2$, $KSr(La_{1-x}Pr_x)(PO_4)_2$, $KSr(Lu_{1-x}Pr_x)(PO_4)_2$, or $NaCa(Y_{1-x}Pr_x)(PO_4)_2$.

4. An ultraviolet light emitting device, comprising:
an excitation light source; and
the phosphor as claimed in claim 2,
wherein the excitation emits a light having a wavelength of 140 nm to 240 nm.

5. The ultraviolet light emitting device as claimed in claim 4, wherein the excitation light source comprises an $Xe_2^*$ excimer lamp.

6. The phosphor as claimed in claim 1, having a formula:

wherein y+z≠0, and
wherein the phosphor is excited by a light having a wavelength of 250 nm to 450 nm to emit a visible light having a major emission peak of 450 nm to 750 nm.

7. The phosphor as claimed in claim 6, having a formula of $K(Ca_{1-y-z}Eu_yMn_z)Y(PO_4)_2$.

8. A visible light emitting device, comprising:
an excitation light source; and
the phosphor as claimed in claim 6,
wherein the excitation emits a light having a wavelength of 250 nm to 450 nm.

9. The visible light emitting device as claimed in claim 8, wherein the excitation light source comprises a laser diode or a light emitting diode.

* * * * *